United States Patent
Lin et al.

(10) Patent No.: US 9,209,040 B2
(45) Date of Patent: Dec. 8, 2015

(54) AMORPHORUS SILICON INSERTION FOR STI-CMP PLANARITY IMPROVEMENT

(71) Applicant: TAIWAN SEMICONDUCTOR MANUFACTURING CO., LTD., Hsinchu (TW)

(72) Inventors: Kuo-Min Lin, Taichung (TW); Wei-Lun Hong, Hsinchu (TW); Ying-Tsung Chen, Hsinchu (TW); Liang-Guang Chen, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 68 days.

(21) Appl. No.: 14/052,687

(22) Filed: Oct. 11, 2013

(65) Prior Publication Data

US 2015/0102456 A1   Apr. 16, 2015

(51) Int. Cl.
*H01L 21/762* (2006.01)
*H01L 21/3105* (2006.01)
*H01L 21/02* (2006.01)

(52) U.S. Cl.
CPC .... *H01L 21/31055* (2013.01); *H01L 21/31053* (2013.01); *H01L 21/76224* (2013.01); *H01L 21/02236* (2013.01)

(58) Field of Classification Search
CPC .............. H01L 21/02123; H01L 21/02255; H01L 21/31055; H01L 21/02126
USPC .................... 438/425, 431, 432; 257/523
See application file for complete search history.

(56) References Cited

U.S. PATENT DOCUMENTS

| 6,136,664 A * | 10/2000 | Economikos et al. ........ 438/431 |
| 7,112,513 B2 * | 9/2006 | Smythe et al. ................ 438/431 |
| 7,541,297 B2 * | 6/2009 | Mallick et al. ................ 438/778 |
| 2002/0022308 A1 * | 2/2002 | Ahn et al. ..................... 438/164 |
| 2004/0180509 A1 * | 9/2004 | Wang et al. ................... 438/424 |
| 2006/0075968 A1 * | 4/2006 | Leung et al. .............. 118/723 R |

* cited by examiner

*Primary Examiner* — Wael Fahmy
*Assistant Examiner* — Sarah Salerno
(74) *Attorney, Agent, or Firm* — McDermott Will & Emery LLP

(57) ABSTRACT

A semiconductor device includes a semiconductor substrate and a trench isolation. The trench isolation is located in the semiconductor substrate, and includes a first cushion layer, a second cushion layer and an insulating filler. The first cushion layer is peripherally enclosed by the semiconductor substrate, the second cushion layer is peripherally enclosed by the first cushion layer, and insulating filler is peripherally enclosed by the second cushion layer. A method for fabricating the semiconductor device is also provided herein.

14 Claims, 8 Drawing Sheets

AMORPHORUS SILICON INSERTION FOR STI-CMP PLANARITY IMPROVEMENT

TECHNICAL FIELD

The present disclosure relates to a shallow trench isolation (STI) structure, and more particularly, to an STI structure having a planarized surface and method for manufacturing the same.

BACKGROUND

In a semiconductor manufacturing, chemical mechanical polishing (CMP) is designed to polish a substrate and to provide a global planarized surface. The CMP process can be implemented at various integrated circuit (IC) fabrication stages, such as a shallow trench isolation (STI) process and a dual damascene process.

In STI, a nitride or other CMP resistant layer is deposited onto a silicon wafer, after which shallow trenches are etched into wafer. Several islands of nitride are left, which are later to become the locations of active areas (transistors, etc.). The trenches are then filled with oxide to form the dielectric areas. After that, the planarization of the wafer needs to be performed a CMP process, in order to acquire optimal gate patterning later on.

However, because the removal rates of metal and dielectric materials are usually different, polishing selectivity leads to undesirable dishing and erosion effects. Dishing often occurs when the metal recedes below or protrudes above the level of the adjacent dielectric. Erosion is a localized thinning of the dielectric. Dishing and erosion are sensitive to pattern structure and pattern density.

For example, STI uses CMP to form a global planarized profile. Over-etching is typically performed to ensure a complete etch of the silicon oxide on silicon nitride. Surface variations associated with local pattern and pattern density may be eliminated by the use of dummy features such as dummy active features in STI trench. Dummy features formed by conventional methods may enhance pattern spatial signature, but may not effectively compensate step height variation.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
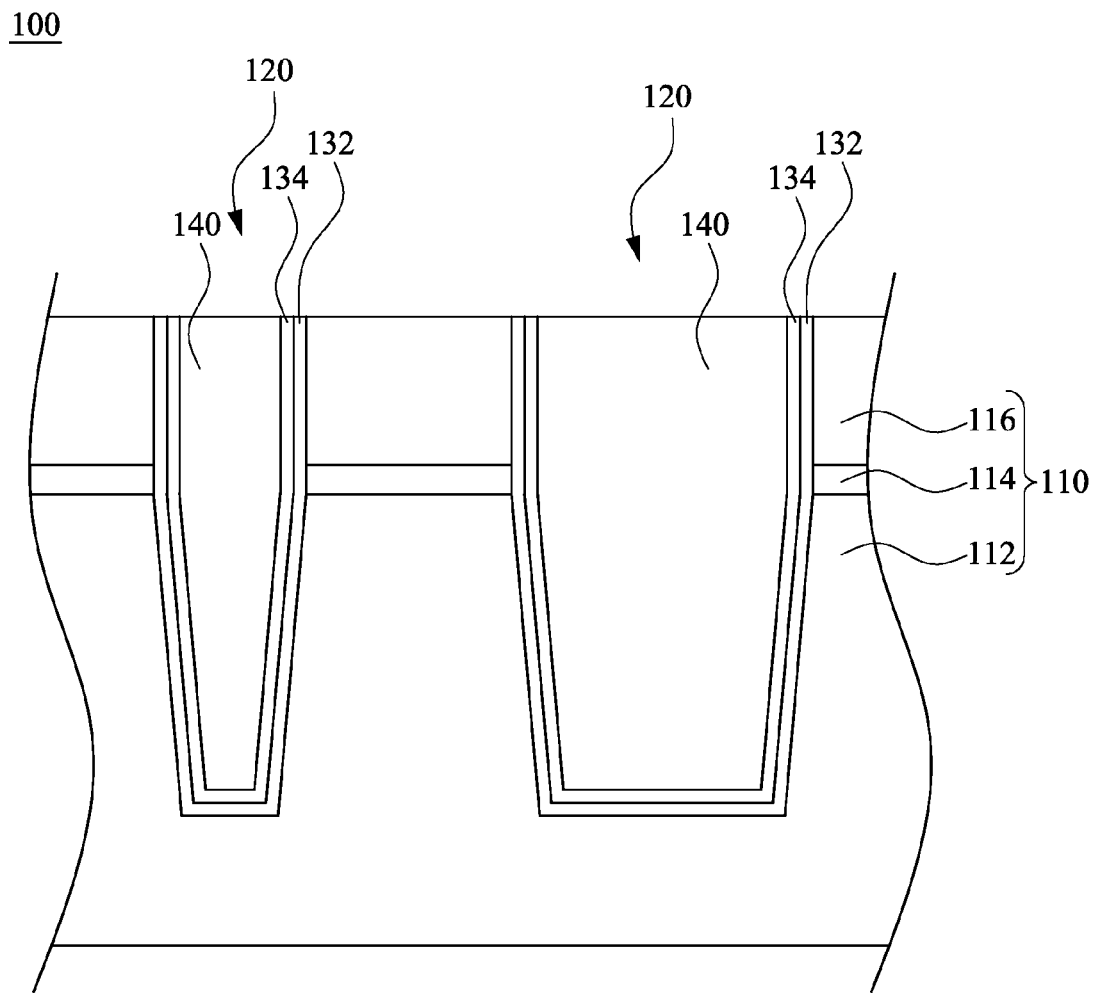
FIG. 1 is a schematic cross-sectional view of a semiconductor device according to various embodiments of the present disclosure.

The embodiments of a semiconductor device and a method for manufacturing the same of the present disclosure are discussed in detail below, but not limited the scope of the present disclosure. The same symbols or numbers are used to the same or similar portion in the drawings or the description. And the applications of the present disclosure are not limited by the following embodiments and examples which the person in the art can apply in the related field.

The singular forms "a," "an" and "the" used herein include plural referents unless the context clearly dictates otherwise. Therefore, reference to, for example, a trench isolation includes embodiments having two or more such trench isolations, unless the context clearly indicates otherwise. Reference throughout this specification to "one embodiment" means that a particular feature, structure, or characteristic described in connection with the embodiment is included in at least one embodiment of the present disclosure. Therefore, the appearances of the phrases "in one embodiment" or "in an embodiment" in various places throughout this specification are not necessarily all referring to the same embodiment. Further, the particular features, structures, or characteristics may be combined in any suitable manner in one or more embodiments. It should be appreciated that the following figures are not drawn to scale; rather, the figures are intended; rather, these figures are intended for illustration.

After a chemical mechanical polishing (CMP) process is performed, a semiconductor device often exhibits dishing on trench isolations, because of the different removal rates of the insulating material and the silicon nitride result in polishing selectivity leading to undesirable dishing and erosion effects. The dishing and erosion effects may result in current leakage or electrical failure.

Embodiments of the present disclosure provide a trench isolation without dishing or erosion effects by insertion of amorphous silicon to prevent current leakage or electrical failure. In the formation process of the trench isolation, a volume-expanded layer is first formed in a trench, and peripherally enclosed by a semiconductor substrate. An insulating filler fills the trench, and peripherally enclosed by the volume-expanded layer. After the volume-expanded layer and the insulating filler are cured, a chemical mechanical polishing (CMP) process is performed to remove excess portions of the volume-expanded layer and the insulating filler. Because the volume-expanded layer is expanded to form cushion layers, the cushion layers are used to elastically support the insulating layer, and prevent the dishing or erosion effect from occurring in the CMP process.

FIG. 1 is a schematic cross-sectional view of a semiconductor device 100 according to various embodiments of the present disclosure. In FIG. 1, the semiconductor device 100 includes a semiconductor substrate 110 and trench isolations 120 in the semiconductor substrate 110.

The semiconductor substrate 110 includes a silicon substrate 112, a pad oxide layer 114 positioned on the silicon substrate 112, and a nitride layer 116 positioned on the pad oxide layer 114.

The trench isolations 120 may be iso-type trench isolations, dense-type trench isolations or the both. The trench isolation 120 includes a first cushion layer 132, a second cushion layer 134 and an insulating filler 140. The first cushion layer 132 is peripherally enclosed by the semiconductor substrate 110. The second cushion layer 134 is peripherally enclosed by the first cushion layer 132, and the insulating filler 140 is peripherally enclosed by the second cushion layer 134.

In various embodiments, the first cushion layer 132 includes silicon oxide, and the second cushion layer 134 includes amorphous silicon. The first cushion layer 132 and the second cushion layer 134 can elastically support the insulating filler 140, and prevent the dishing or erosion effect from occurring in the CMP process. In various embodiments, the coefficient of elasticity of the second cushion layer 134 is greater than the coefficient of elasticity of the first cushion layer 132.

By performing an inhomogeneous oxidation, the first cushion layer 132 and the second cushion layer 134 may have a concentration gradient of silicon oxide and amorphous silicon. In the first cushion layer 132, the concentration of silicon oxide is greater than the concentration of amorphous silicon. In the second cushion layer 134, the concentration of amorphous silicon is greater than the concentration of silicon oxide. In various embodiments, the total thickness of the first and the second cushion layers (132 and 134) is in a range from about 1 Angstrom to about 100 Angstroms.

In various embodiments, the material of the insulating filler 140 is silicon dioxide, carbon doped silicon dioxide, nitrogen doped silicon dioxide, germanium doped silicon dioxide or phosphorus doped silicon dioxide, or a flowable oxide.

FIGS. 2A-2F are schematic cross-sectional views at various stages of fabricating a semiconductor device 200 according to various embodiments of the present disclosure. The method can locally repair all types of aforementioned defects, so as to prevent dishing or erosion effect from occurring in the semiconductor device according to various embodiments of the present disclosure.

Figure 2A:
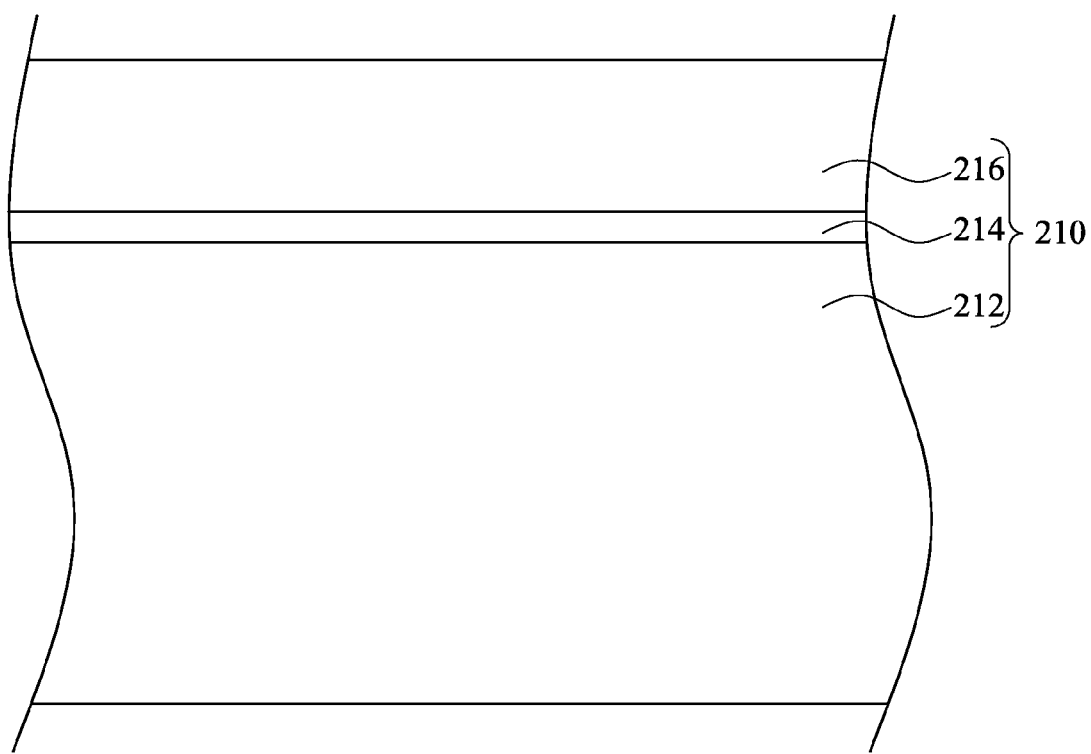
FIGS. 2A-2F are schematic cross-sectional views at various stages of fabricating a semiconductor device according to various embodiments of the present disclosure.

In FIG. 2A, a semiconductor substrate 210 is provided. In some embodiments, the semiconductor substrate 210 includes a silicon substrate 212, a pad oxide layer 212 on the silicon substrate 212, and a nitride layer 216 on the pad oxide layer 214.

Figure 2B:
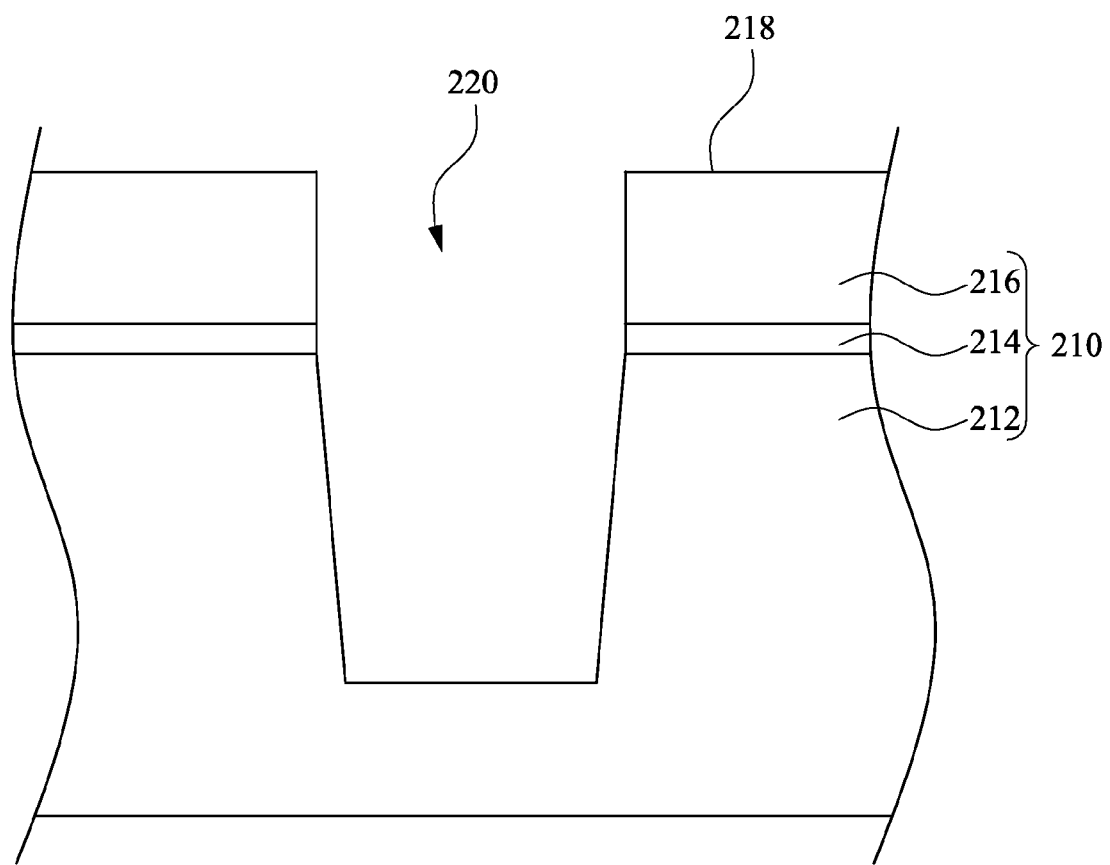

Referring to FIG. 2B, a trench 220 is etched in the semiconductor substrate 210. The semiconductor substrate has a top surface 218. In some embodiments, the trench 220 is etched by a dry-etching process or a wet-etching process.

Figure 2C:
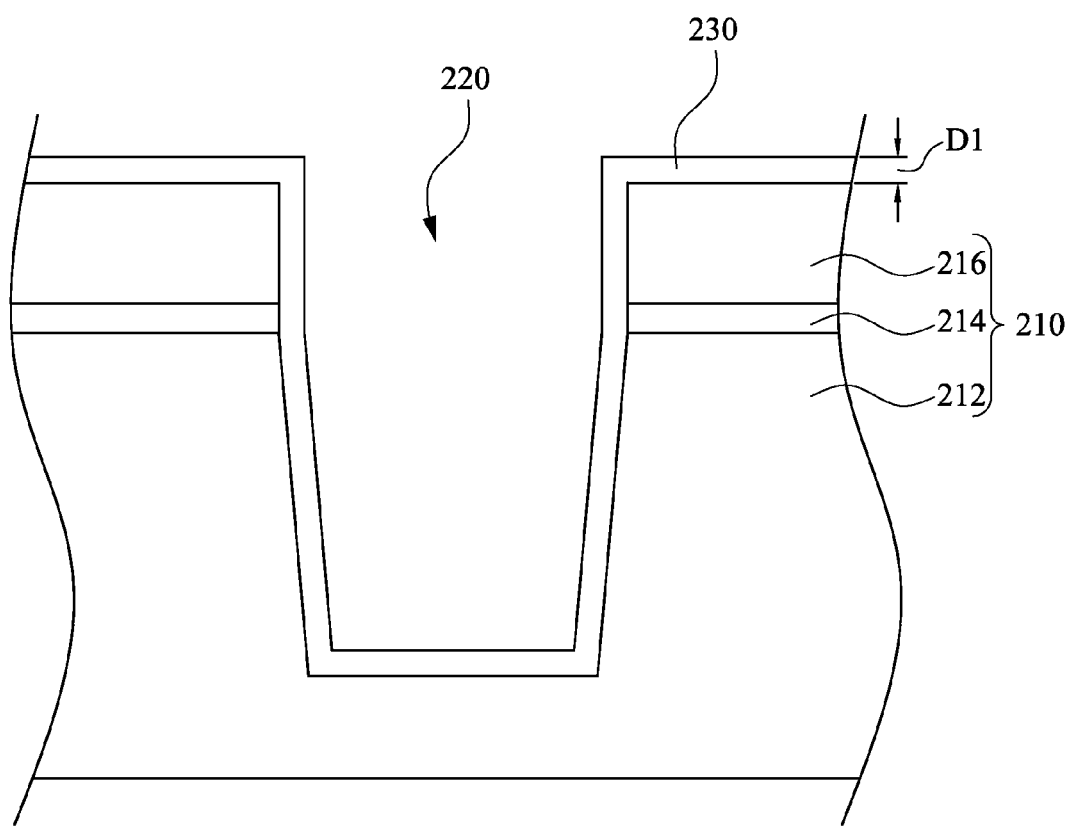

Still referring to FIG. 2C, a volume-expanded layer 230 is formed conformal to the trench 220. The volume-expanded layer 230 is formed by using chemical vapor deposition (CVD) or physical vapor deposition (PVD). In some embodiments, the volume-expanded layer 230 is formed by using a high density plasma chemical vapor deposition (HDPCVD) process. In some embodiments, the volume-expanded layer 330 is formed from amorphous silicon, and the thickness (D1) of the volume-expanded layer is in a range of from about 1 Angstrom to about 45 Angstroms.

Figure 2D:
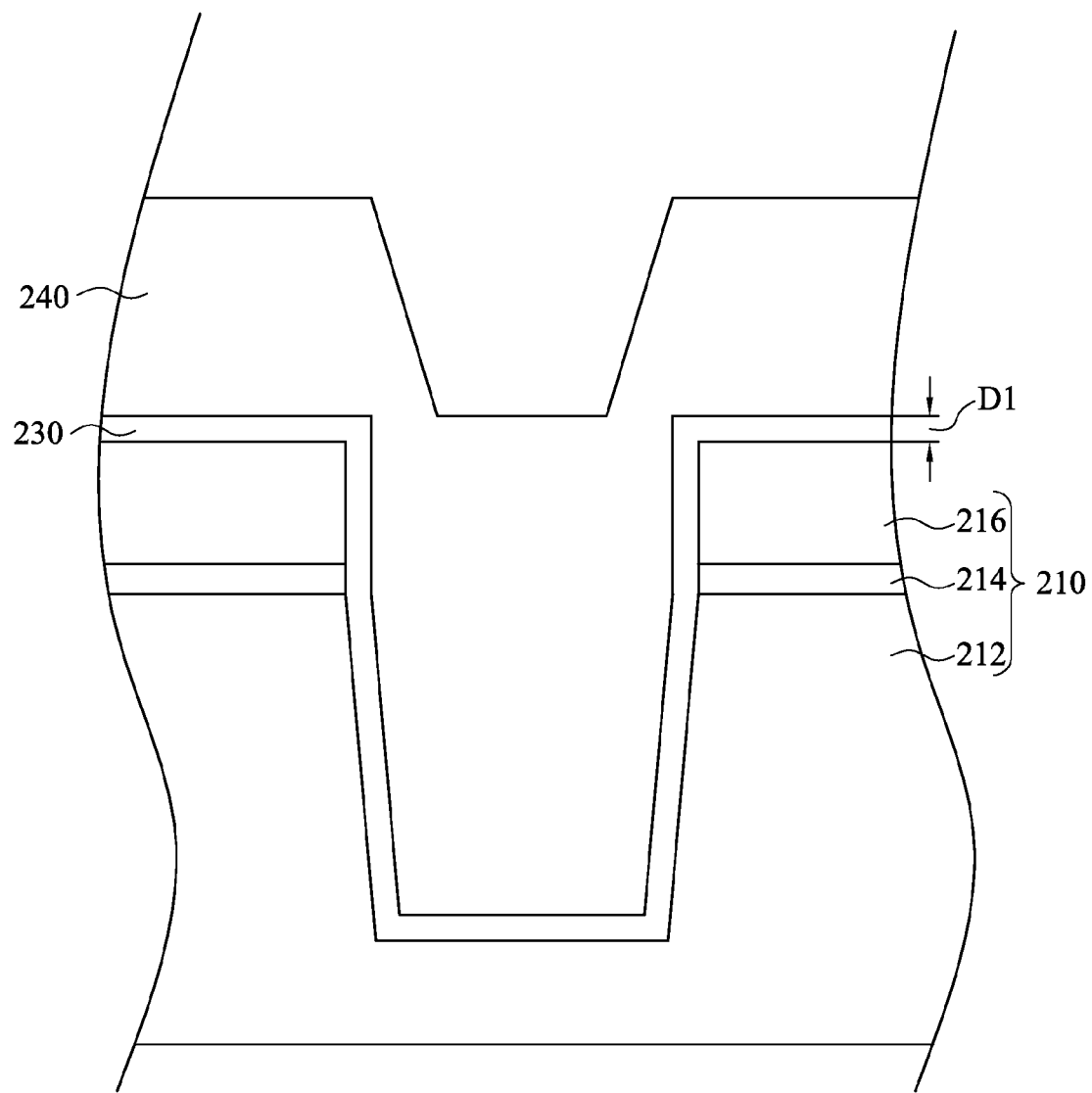

In FIG. 2D, the trench (see 220 in FIG. 2C) is filled with an insulating material 240 on the volume-expanded layer 230. The insulating material 240 is filled by a spin on glass (SOG) or flowable chemical vapor deposition (FCVD) process. In some embodiments, the insulating layer is silicon oxide, silicon dioxide, carbon doped silicon dioxide, nitrogen doped silicon dioxide, germanium doped silicon dioxide or phosphorus doped silicon dioxide, or a flowable oxide.

Figure 2E:
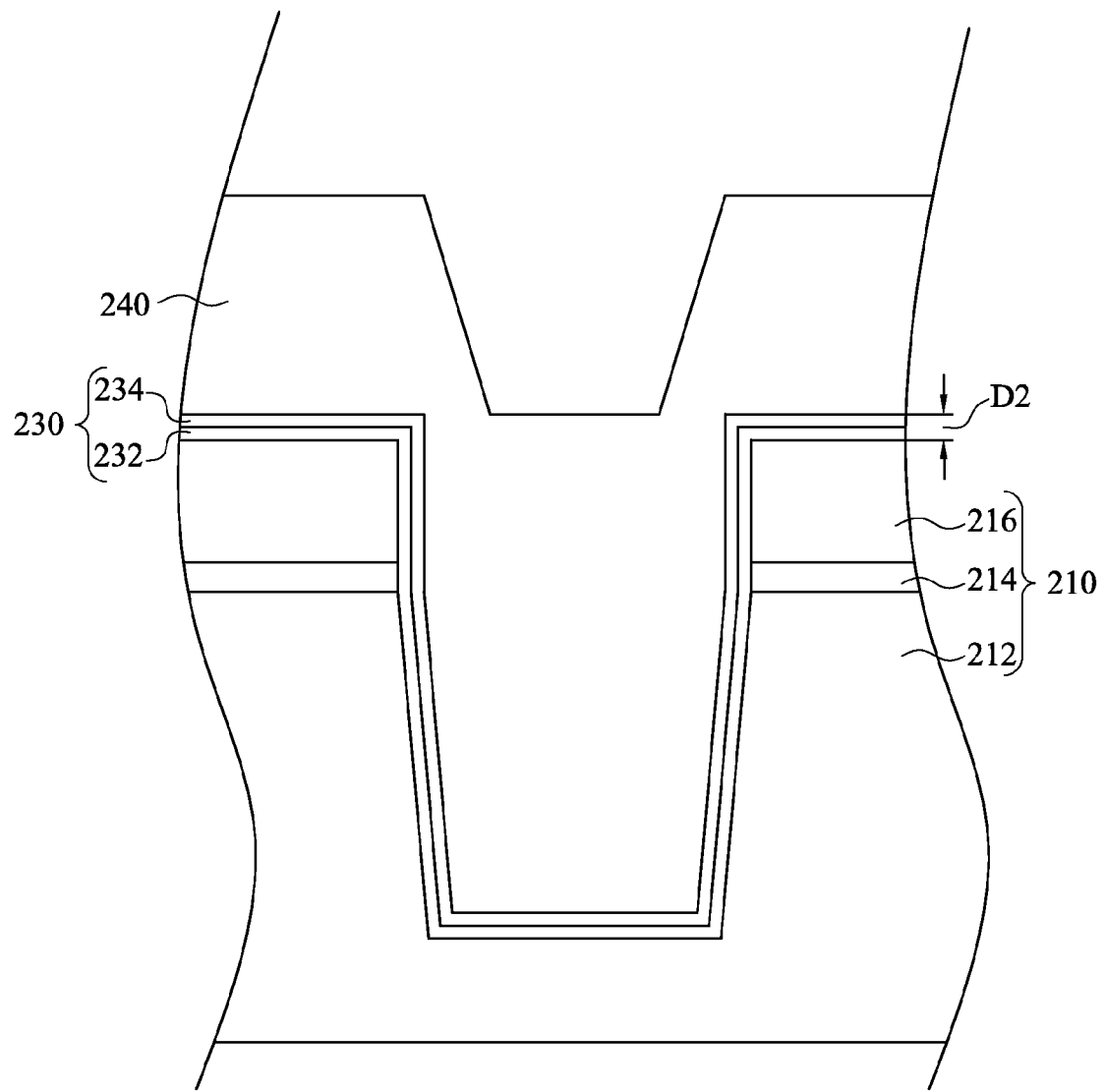

Referring to FIG. 2E, the volume-expanded layer 230 and the insulating layer 240 are cured. In some embodiments, the volume-expanded layer and the insulating layer are cured by using a thermal process in a temperature range of 850° C. to 1,100° C. In the thermal process, the volume-expanded layer is oxidized, and the volume of the volume-expanded layer is expanded.

In some embodiments, an inhomogeneous oxidation is performed on the volume-expanded layer 230 to form a first cushion layer 232 in the trench (see 220 in FIG. 2C) and a second cushion layer 234 on the first cushion layer 232, as shown in FIG. 2E. The first cushion layer 232 is formed by a low oxidation of a part of the volume-expanded layer 230, and the second cushion layer 234 is formed by a high oxidation of another part of the volume-expanded layer 230.

The first cushion layer 232 and the second cushion layer 234 may have a concentration gradient of silicon oxide and amorphous silicon. In the first cushion layer 232, the concentration of silicon oxide is greater than the concentration of amorphous silicon. In the second cushion layer 234, the concentration of amorphous silicon is greater than the concentration of silicon oxide. In various embodiments of the present disclosure, the first cushion layer includes silicon oxide, and the second cushion layer includes amorphous silicon. In various embodiments, the total thickness (D2) of the first and the second cushion layers is in a range from about 1 Angstrom to about 100 Angstroms.

Figure 2F:
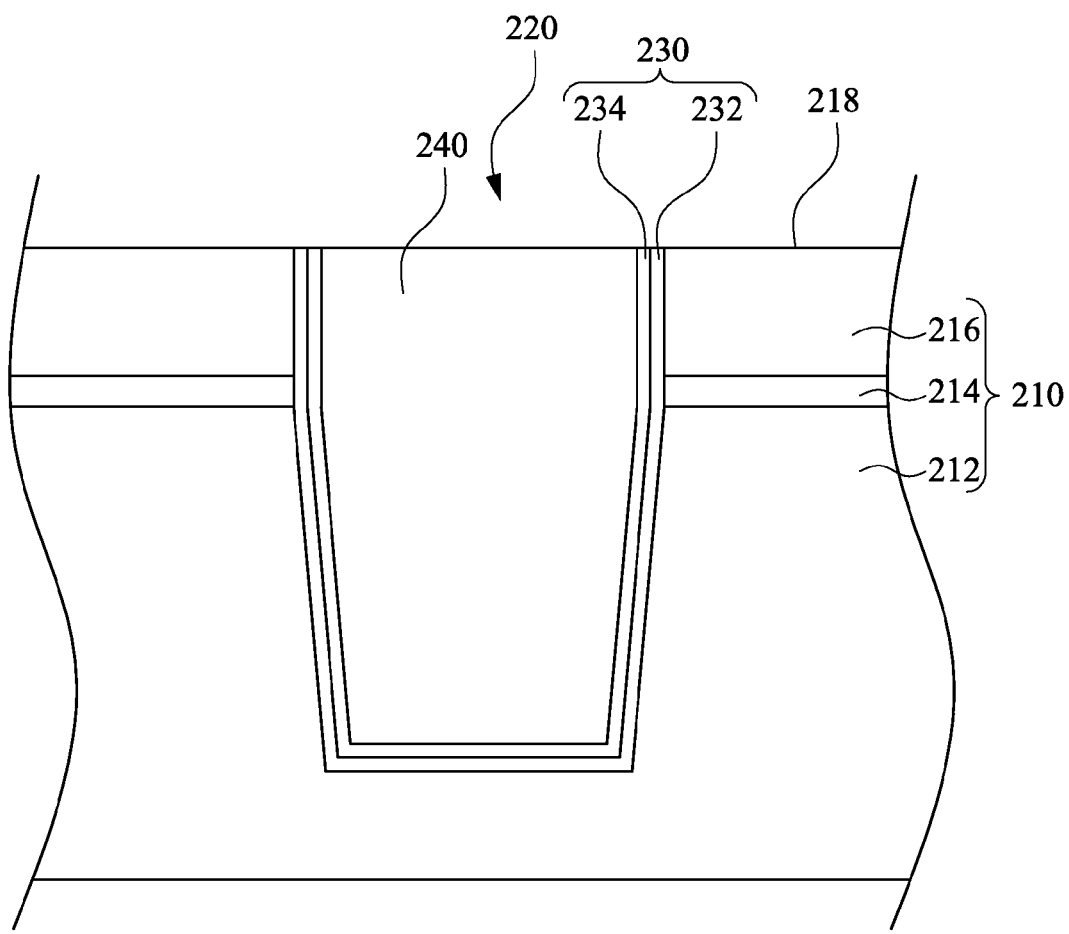

Still referring to FIG. 2F, a planarization process is performed to remove excess portions of the volume-expanded layer 230 and the insulating layer 240 over the top surface 218 of the semiconductor substrate 210. The first cushion layer 232 and the second cushion layer 234 can elastically support the insulating filler 240, and prevent the dishing or erosion effect from occurring in the CMP process. In various embodiments, the coefficient of elasticity of the second cushion layer is greater than the coefficient of elasticity of the first cushion layer. In various embodiments of the present disclosure, the planarization process is a CMP process.

Figure 3:
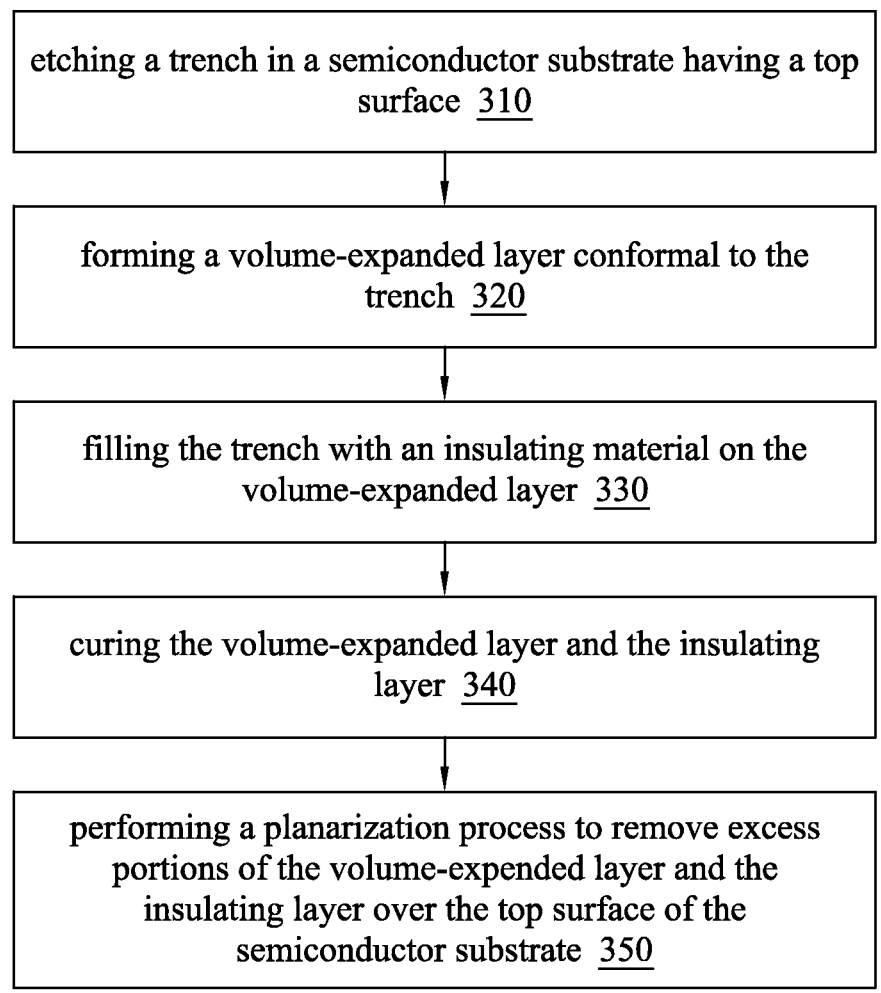
FIG. 3 is a flowchart illustrating a method of manufacturing a semiconductor device according to various embodiments of the present disclosure.

FIG. 3 is a flowchart illustrating a method of manufacturing a semiconductor device according to various embodiments of the present disclosure. Operations 310 to 350 are described in association with the cross-sectional views of the semiconductor device 200 from FIGS. 2A to 2F at various fabrication stages.

In operation 310, a trench 220 is formed in a semiconductor substrate 210 by an etching process. The semiconductor substrate has a top surface 218. Referring to FIG. 2A, the semiconductor substrate 210 includes a silicon substrate 212, a pad oxide layer 214 on the silicon substrate 212, and a nitride layer 216 on the pad oxide layer 214. For example, the pad oxide layer 214 is formed from silicon oxide, and the nitride layer 216 is formed from silicon nitride. The trench 220 is etched by a dry-etching process or a wet-etching process, as shown in FIG. 2B.

Still referring to operation 320, a volume-expanded layer 230 is formed conformal to the trench 220. In FIG. 2C, the volume-expanded layer 230 is formed by using chemical vapor deposition (CVD) or physical vapor deposition (PVD). In some embodiments, the volume-expanded layer 230 is formed by using a high density plasma chemical vapor deposition (HDPCVD) process. In some embodiments, the volume-expanded layer 230 is formed from amorphous silicon, and the thickness (D1) of the volume-expanded layer is in a range of from about 1 Angstrom to about 45 Angstroms.

Referring to operation 330, the trench 220 is filled with an insulating material 240 on the volume-expanded layer 230. In FIG. 3D, a spin on glass (SOG) or flowable chemical vapor deposition (FCVD) process is used to fill the insulating material 240. In some embodiments, the insulating layer is silicon oxide, silicon dioxide, carbon doped silicon dioxide, nitrogen doped silicon dioxide, germanium doped silicon dioxide or phosphorus doped silicon dioxide, or a flowable oxide.

In operation 340, the volume-expanded layer 230 and the insulating layer 240 are cured. Referring to FIG. 2E, the volume-expanded layer 230 and the insulating layer 240 are cured by using a thermal process in a temperature range of 850° C. to 1,100° C. In the thermal process, the volume-expanded layer 230 is oxidized, and the volume of the volume-expanded layer 230 is expanded.

In some embodiments, an oxidation is performed on the volume-expanded layer to form a cushion layer in the trench. The cushion layer is formed from silicon while amorphous silicon forming the volume-expanded layer is oxidized. The cushion layer has a thickness ranging from about 1 Angstrom to about 100 Angstroms.

In FIG. 2E, an inhomogeneous oxidation is performed on the volume-expanded layer 230 to form a first cushion layer 232 in the trench (see 220 in FIG. 2C) and a second cushion layer 234 on the first cushion layer 232. The first cushion layer 232 is formed by a low oxidation of a part of the volume-expanded layer 230, and the second cushion layer 234 is formed by a high oxidation of another part of the volume-expanded layer 230.

The first cushion layer 232 and the second cushion layer 234 may have a concentration gradient of silicon oxide and amorphous silicon. In the first cushion layer 232, the concentration of silicon oxide is greater than the concentration of amorphous silicon. In the second cushion layer 234, the concentration of amorphous silicon is greater than the concentration of silicon oxide. In various embodiments, the first cushion layer includes silicon oxide, and the second cushion layer includes amorphous silicon. In various embodiments of the present disclosure, the total thickness (D2) of the first and the second cushion layers is in a range from about 1 Angstrom to about 100 Angstroms. Because the volume-expanded layer is cured by a thermal process, the volume of the volume-expanded layer is expanded, so that the total thickness (D2) of the first and the second cushion layer is greater than the thickness (D1) of the volume-expanded layer without curing.

Referring to operation 350, a planarization process is performed to remove excess portions of the volume-expanded layer 230 and the insulating layer 240 over the top surface 218 of the semiconductor substrate 210. In various embodiments, the planarization process is a CMP process.

In FIG. 2F, the first cushion layer 232 and the second cushion layer 234 can elastically support the insulating filler 240, and prevent the dishing or erosion effect from occurring in the CMP process. In various embodiments, the coefficient of elasticity of the second cushion layer is greater than the coefficient of elasticity of the first cushion layer.

In accordance with some embodiments, the present disclosure discloses a semiconductor device including a semiconductor substrate and a trench isolation. The trench isolation is located in the semiconductor substrate, and includes a first cushion layer, a second cushion layer and an insulating filler. The first cushion layer is peripherally enclosed by the semiconductor substrate, the second cushion layer is peripherally enclosed by the first cushion layer, and insulating filler is peripherally enclosed by the second cushion layer.

In accordance with some embodiments, the present disclosure disclosed a method for fabricating a semiconductor device. In this method, a trench is etched in a semiconductor having a top surface. A volume-expanded layer is formed conformal to the trench. The trench is filled with an insulating material on the volume-expanded layer. The volume-expanded layer and the insulating layer are cured, and then a planarization process is performed to remove excess portions of the volume-expanded layer and the insulating layer over the top surface of the semiconductor substrate.

In various embodiments of the present disclosure, an inhomogeneous oxidation is performed on the volume-expanded layer to form a first cushion layer in the trench and a second cushion layer on the first cushion layer. The first cushion layer is formed by a low oxidation of a part of the volume-expanded layer. And, the second cushion layer is formed by a high oxidation of another part of the volume-expanded layer. Therefore, the first cushion layer and the second cushion layer have a concentration gradient of silicon oxide and amorphous silicon. And, the first cushion layer and the second cushion layer can elastically support the insulating filler, and prevent the dishing or erosion effect occurred during the CMP process.

Although embodiments of the present disclosure and their advantages have been described in detail, they are not used to limit the present disclosure. It should be understood that various changes, substitutions and alterations can be made herein without departing from the spirit and scope of the present disclosure. Therefore, the protecting scope of the present disclosure should be defined as the following claims.

What is claimed is:

1. A semiconductor device, comprising:
   a semiconductor substrate; and
   a trench isolation in the semiconductor substrate, the trench isolation comprising:
   a first cushion layer peripherally enclosed by the semiconductor substrate;
   a second cushion layer peripherally enclosed by the first cushion layer, both the first cushion layer and the second cushion layer having a concentration gradient of silicon oxide and amorphous silicon; and
   an insulating filler peripherally enclosed by the second cushion layer,
   wherein the coefficient of elasticity of the second cushion layer is greater than the coefficient of elasticity of the first cushion layer, and
   wherein the first cushion layer has a concentration of silicon oxide greater than a concentration of amorphous silicon thereof, and the second cushion layer has a concentration of amorphous silicon greater than a concentration of silicon oxide thereof.

2. The semiconductor device of claim 1, a total thickness of the first and the second cushion layers is in a range from 1 Angstrom to 100 Angstroms.

3. The semiconductor device of claim 1, wherein the material of the insulating filler is selected from the group consisting of silicon dioxide, carbon doped silicon dioxide, nitrogen doped silicon dioxide, germanium doped silicon dioxide or phosphorus doped silicon dioxide and a flowable oxide.

4. A method for fabricating a semiconductor device, the method comprising:
   etching a trench in a semiconductor substrate having a top surface;
   forming a volume-expanded layer conformal to the trench;
   filling the trench with an insulating material on the volume-expanded layer;
   curing the volume-expanded layer and the insulating layer such that the volume-expanded layer is converted into a first cushion layer and a second cushion layer, both the first cushion layer and the second cushion layer having a concentration gradient of silicon oxide and amorphous silicon, wherein the first cushion layer has a concentration of silicon oxide greater than a concentration of amorphous silicon thereof, and the second cushion layer has a concentration of amorphous silicon greater than a concentration of silicon oxide thereof; and
   performing a planarization process to remove excess portions of the volume-expanded layer and the insulating layer over the top surface of the semiconductor substrate.

5. The method of claim 4, wherein the operation of forming the volume-expanded layer comprises forming the volume-expanded layer using chemical vapor deposition (CVD) or physical vapor deposition (PVD).

6. The method of claim 4, wherein the operation of forming the volume-expanded layer comprises forming the volume-expanded layer using a high density plasma chemical vapor deposition (HDPCVD) process.

7. The method of claim 4, wherein the operation of forming the volume-expanded layer comprises forming an amorphous silicon layer.

8. The method of claim 4, wherein the thickness of the volume-expanded layer is in a range of from 1 Angstrom to 45 Angstroms.

9. The method of claim 4, wherein the operation of curing the volume-expanded layer and the insulating layer comprises curing the volume-expanded layer and the insulating layer using a thermal process in a temperature range of 850☐ to 1,100☐, for oxidizing the volume-expanded layer in which volume expansion occurs.

10. The method of claim 1, wherein a total thickness of the first and second cushion layers is ranged from 1 Angstrom to 100 Angstroms.

11. The method of claim 4, wherein the operation of curing the volume-expanded layer comprises:
performing an inhomogeneous oxidation on the volume-expanded layer to form the first cushion layer in the trench and the second cushion layer on the first cushion layer.

12. The method of claim 4, wherein the material of the insulating layer is selected from a group comprising of silicon oxide, silicon dioxide, carbon doped silicon dioxide, nitrogen doped silicon dioxide, germanium doped silicon dioxide or phosphorus doped silicon dioxide and a flowable oxide.

13. The method of claim 12, wherein the operation of filling the insulating material comprises filling the flowable oxide using a spin on glass (SOG) or flowable chemical vapor deposition (FCVD) process.

14. The method of claim 4, wherein the planarization process is a chemical mechanical polishing (CMP) process.

\* \* \* \* \*